US011322536B2

(12) United States Patent
Kim et al.

(10) Patent No.: US 11,322,536 B2
(45) Date of Patent: May 3, 2022

(54) IMAGE SENSOR AND METHOD OF FABRICATING THE SAME

(71) Applicant: SAMSUNG ELECTRONICS CO., LTD., Suwon-si (KR)

(72) Inventors: Hongki Kim, Hwaseong-si (KR); Donghyun Kim, Hwaseong-si (KR); Minkyung Kim, Yongin-si (KR); Minkwan Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 23 days.

(21) Appl. No.: 16/387,106

(22) Filed: Apr. 17, 2019

(65) Prior Publication Data
US 2020/0083268 A1    Mar. 12, 2020

(30) Foreign Application Priority Data
Sep. 7, 2018   (KR) .......................... 10-2018-0107279

(51) Int. Cl.
*H01L 27/30*   (2006.01)
*H01L 27/146*  (2006.01)

(52) U.S. Cl.
CPC .... *H01L 27/14621* (2013.01); *H01L 27/1462* (2013.01); *H01L 27/1463* (2013.01); *H01L 27/14685* (2013.01); *H01L 27/307* (2013.01); *H01L 27/14627* (2013.01); *H01L 27/14636* (2013.01)

(58) Field of Classification Search
CPC ........................... H01L 27/307; H01L 27/146
See application file for complete search history.

(56) References Cited

U.S. PATENT DOCUMENTS

| 8,237,834 | B2 | 8/2012 | Inuiya |
| 9,160,953 | B2 | 10/2015 | Oishi |
| 9,564,468 | B2 | 2/2017 | Chou et al. |
| 9,786,704 | B2 | 10/2017 | Cheng et al. |
| 2014/0016012 | A1* | 1/2014 | Oishi ................. H04N 5/372 348/311 |
| 2014/0339606 | A1 | 11/2014 | Lin et al. |
| 2016/0112614 | A1* | 4/2016 | Masuda ........... H01L 27/14623 348/374 |
| 2016/0276394 | A1* | 9/2016 | Chou ............... H01L 27/14621 |
| 2018/0301491 | A1* | 10/2018 | Nakamoto ....... H01L 27/14685 |
| 2019/0157329 | A1 | 5/2019 | Kim et al. |

FOREIGN PATENT DOCUMENTS

JP    2014-22649 A   2/2014

* cited by examiner

*Primary Examiner* — Moazzam Hossain
*Assistant Examiner* — Hajar Kolahdouzan
(74) *Attorney, Agent, or Firm* — Sughrue Mion, PLLC

(57) ABSTRACT

An image sensor is disclosed. The image sensor may include a plurality of unit pixels, a color filter array provided on the plurality unit pixels, the color filter array including color filters, an anti-reflection layer disposed between the plurality of unit pixels and the color filter array, and a fence pattern including a lower portion buried in the anti-reflection layer and an upper portion separating the color filters from each other. A width of the upper portion of the fence pattern may be greater than a width of the lower portion.

20 Claims, 16 Drawing Sheets

IMAGE SENSOR AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2018-0107279, filed on Sep. 7, 2018, in the Korean Intellectual Property Office, the entire contents of which are hereby incorporated by reference.

BACKGROUND OF THE INVENTION

The present disclosure relates to an image sensor, and in particular, to a complementary metal-oxide-semiconductor (CMOS) image sensor.

An image sensor is an electronic device that converts optical images into electrical signals. With the recent development of the computer and communications industries, there is an increased demand for high performance image sensors in a variety of applications such as digital cameras, camcorders, personal communication systems, gaming machines, security cameras, micro-cameras for medical applications, and/or robots.

The image sensors may be generally classified into charge-coupled-device (CCD) and complementary metal-oxide-semiconductor (CMOS) image sensors. Since the CMOS image sensors has a simple operation method and can be provided in the form of a single chip, in which signal processing circuits are integrated, it is possible to reduce a size of a product therewith. In addition, since the CMOS image sensor requires a relatively low consumption power, it is easily applicable to an electronic device with a limited battery capacity. Furthermore, the CMOS image sensor can be fabricated using CMOS fabrication techniques, and thus, it is possible to reduce a manufacturing cost thereof. Moreover, the CMOS image sensor can provide high resolution images. Accordingly, the use of CMOS image sensors is rapidly being increased.

SUMMARY

Some embodiments of the inventive concept provide an image sensor with improved optical characteristics.

According to some embodiments of the inventive concept, an image sensor may include a plurality of unit pixels, a color filter array provided on the plurality of unit pixels, the color filter array including color filters, an anti-reflection layer disposed between the plurality of unit pixels and the color filter array, and a fence pattern including a lower portion buried in the anti-reflection layer and an upper portion separating the color filters from each other, wherein a width of the upper portion of the fence pattern may be greater than a width of the lower portion.

According to some embodiments of the inventive concept, an image sensor may include a plurality of unit pixels, a color filter array provided on the plurality of unit pixels, the color filter array including color filters, an anti-reflection layer disposed between the plurality of unit pixels and the color filter array, and a fence pattern including a lower portion buried in the anti-reflection layer and an upper portion separating the color filters from each other, wherein a width of the upper portion of the fence pattern is greater than a width of the lower portion, and the anti-reflection layer includes anti-reflection patterns, which are separated from each other by the fence pattern and are provided on the plurality of unit pixels, respectively.

According to some embodiments of the inventive concept, a method of fabricating an image sensor may include providing a substrate including unit pixels, sequentially forming an anti-reflection layer and a sacrificial layer on a first surface of the substrate, patterning the sacrificial layer and the anti-reflection layer to form a trench, forming a fence pattern to fill the trench, removing the sacrificial layer to form openings, each of which is defined by a side surface of the fence pattern and a top surface of the anti-reflection layer, and forming color filters in the openings.

DETAILED DESCRIPTION

Example embodiments of the inventive concepts will now be described more fully with reference to the accompanying drawings, in which example embodiments are shown.

Figure 1:
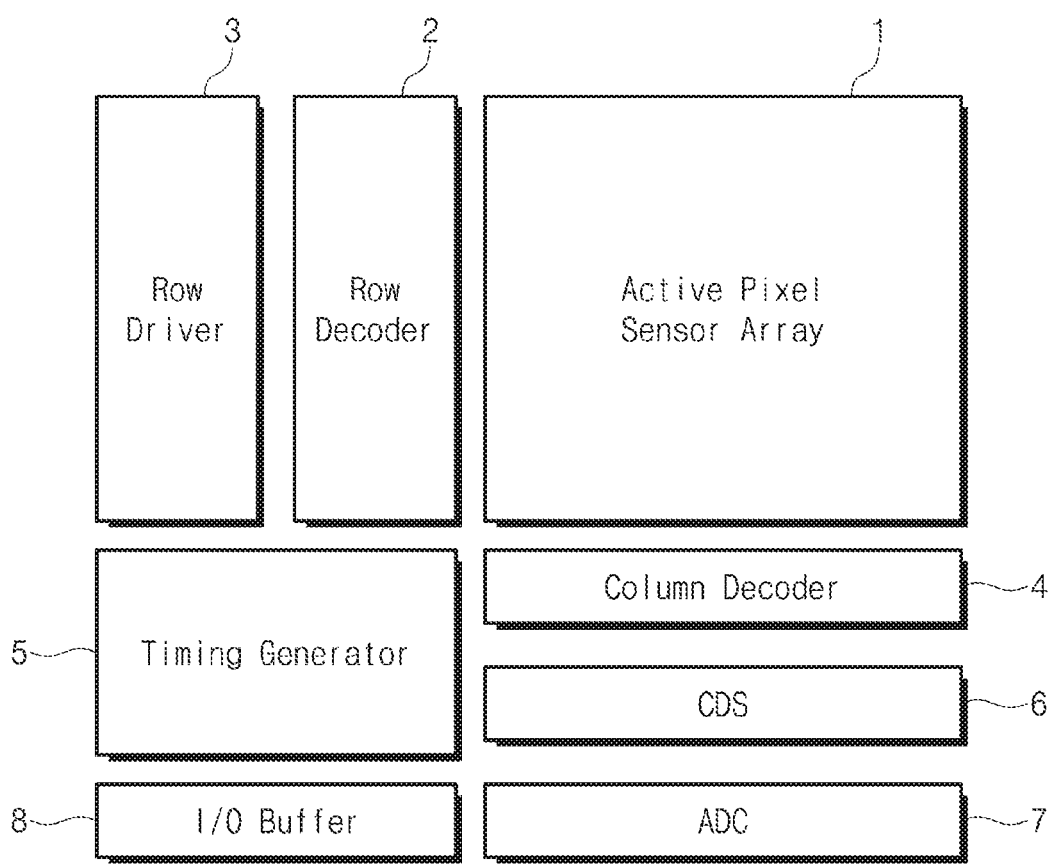
FIG. 1 is a block diagram illustrating an image sensor according to some embodiments of the inventive concept.

FIG. 1 is a block diagram illustrating an image sensor, according to some embodiments of the inventive concept.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of unit pixels that are arranged two-dimensionally and are used to convert optical signals to electrical signals. The active pixel sensor array 1 may be driven by a plurality of driving signals, such as a pixel selection signal, a reset signal, and a charge transfer signal, which are transmitted from the row driver 3. The converted electrical signal may be provided to the correlated double sampler 6.

The row driver 3 may be configured to provide a plurality of driving signals for driving the plurality of unit pixels to the active pixel sensor array 1, based on the result decoded by the row decoder 2. In the case where the unit pixels are arranged in a matrix shape, the driving signals may be supplied to respective rows of the unit pixels.

The timing generator 5 may be configured to provide timing and control signals to the row decoder 2 and the column decoder 4.

The correlated double sampler 6 may be configured to receive the electric signals generated in the active pixel sensor array 1 and to perform an operation of holding and sampling the received electric signals. For example, the correlated double sampler 6 may perform a double sampling operation using a specific noise level and a signal level of the electric signal and then output a difference level corresponding to a difference between the noise and signal levels.

The analog-to-digital converter 7 may be configured to convert an analog signal, which correspond to the difference level output from the correlated double sampler 6, into a digital signal, and then to output the converted digital signals to the I/O buffer 8.

The I/O buffer 8 may be configured to latch the digital signal and to sequentially output the latched digital signal to an image signal processing unit (not shown), based on the result decoded by the column decoder 4.

Figure 2:
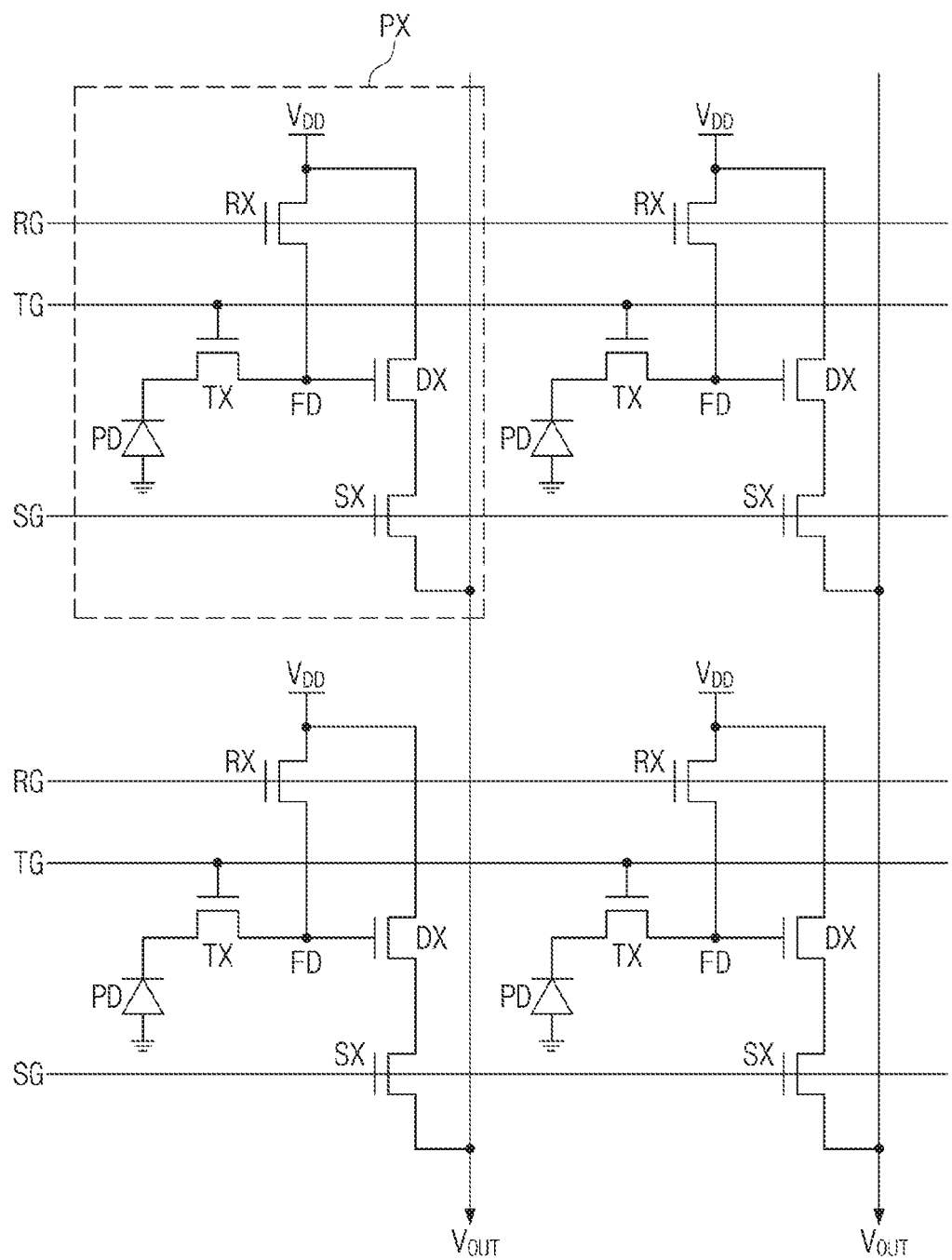
FIG. 2 is a circuit diagram of an active pixel sensor array of an image sensor according to some embodiments of the inventive concept.

FIG. 2 is a circuit diagram of an active pixel sensor array of an image sensor according to some embodiments of the inventive concept.

Referring to FIGS. 1 and 2, the active pixel sensor array 1 may include a plurality of unit pixels PX, which are arranged in a matrix shape. Each of the unit pixels PX may include a transfer transistor TX and logic transistors RX, SX, and DX. The logic transistors may include a reset transistor RX, a selection transistor SX, and a drive transistor DX. The transfer transistor TX may include a transfer gate TG. Each of the unit pixels PX may further include a photoelectric conversion device PD and a floating diffusion region FD.

The photoelectric conversion device PD may be configured to generate and hold photocharges whose amount is in proportional to an amount of an externally incident light. The photoelectric conversion device PD may include a photo diode, a photo transistor, a photo gate, a pinned photo diode, or any combination thereof. The transfer transistor TX may be configured to transfer electric charges, which are generated in the photoelectric conversion device PD, to the floating diffusion region FD. The charges generated in the photoelectric conversion device PD may be transferred to and cumulatively stored in the floating diffusion region FD. The drive transistor DX may be controlled by an amount of the photocharges to be stored in the floating diffusion region FD.

The reset transistor RX may be configured to periodically discharge the photocharges stored in the floating diffusion region FD. The reset transistor RX may include a drain electrode, which is connected to the floating diffusion region FD, and a source electrode, which is connected to a power voltage VDD. If the reset transistor RX is turned on, the power voltage VDD may be applied to the floating diffusion region FD through the source electrode of the reset transistor RX. Accordingly, the electric charges stored in the floating diffusion region FD may be discharged through the reset transistor RX in the turned-on state, and as a result, the floating diffusion region FD may be in a reset state.

The drive transistor DX may serve as a source follower buffer amplifier. The drive transistor DX may be configured to amplify a variation in electric potential of the floating diffusion region FD and to output the amplified signal to an output line Vout.

The selection transistor SX may be used to select each row of the unit pixels PX for a read operation. If the selection transistor SX is turned on, the power voltage VDD may be applied to a drain electrode of the drive transistor DX.

Figure 3:
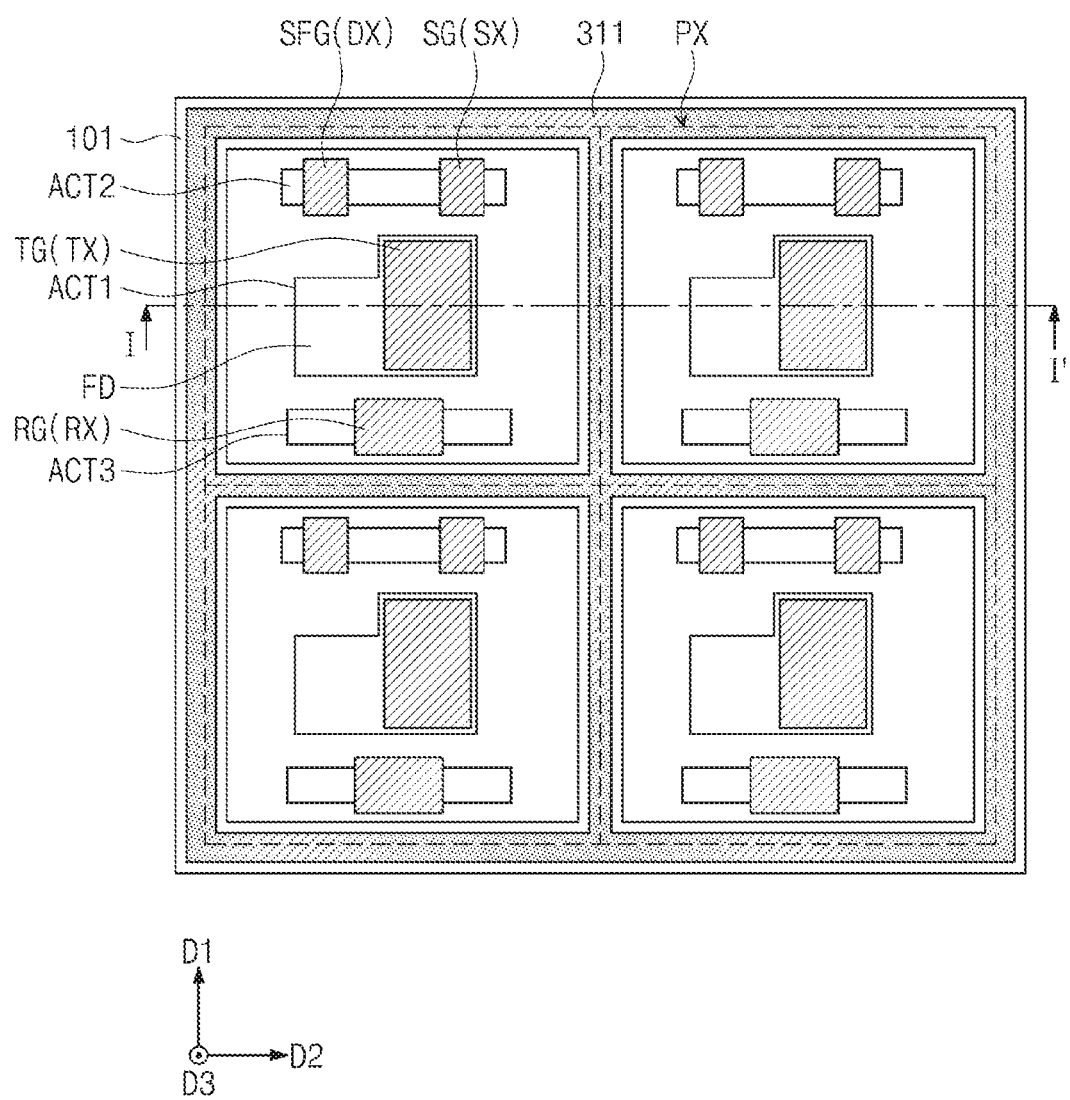
FIG. 3 is a plan view illustrating an image sensor according to some embodiments of the inventive concept.
Figure 4:
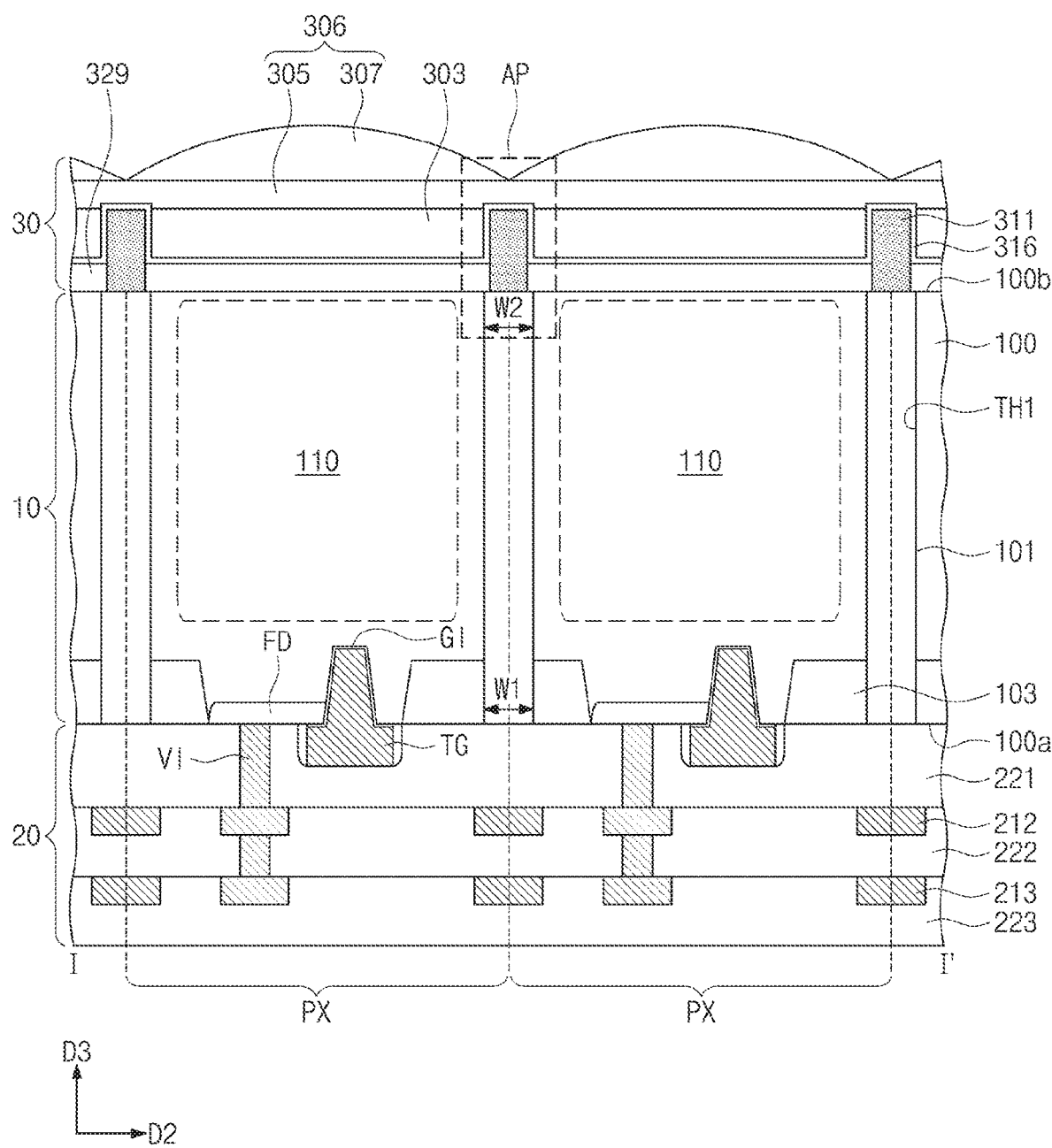
FIG. 4 is a sectional view taken along line I-I' of FIG. 3.

FIG. 3 is a plan view illustrating an image sensor according to some embodiments of the inventive concept. FIG. 4 is a sectional view taken along line I-I' of FIG. 3.

Referring to FIGS. 2, 3, 4, and 5A, an image sensor according to example embodiments of the inventive concept may include a photoelectric conversion layer 10, an interconnection layer 20, and an optically-transparent layer 30. The photoelectric conversion layer 10 may be interposed between the interconnection layer 20 and the optically-transparent layer 30. The photoelectric conversion layer 10 may include a semiconductor substrate 100 and photoelectric conversion regions 110, which are provided in the semiconductor substrate 100. The photoelectric conversion regions 110 may convert light, which is incident from the outside, to electrical signals.

The semiconductor substrate 100 may have a front or first surface 100a and a rear or second surface 100b, which are opposite to each other. The interconnection layer 20 may be disposed on the first surface 100a of the semiconductor substrate 100, and the optically-transparent layer 30 may be disposed on the second surface 100b of the semiconductor substrate 100.

The interconnection layer 20 may include first and second wires 212 and 213. The transfer transistors TX may be electrically connected to the photoelectric conversion regions 110. The first and second wires 212 and 213 may be vertically connected to the transfer transistors TX and the logic transistors RX, SX, and DX through vias VI, which are formed in a first interlayered insulating layer 221. The interconnection layer 20 may be configured to process electrical signals, which are converted in the photoelectric conversion regions 110. The first and second wires 212 and 213 may be provided in second and third interlayered insulating layers 222 and 223, respectively, which are stacked on the first surface 100a of the semiconductor substrate 100. In some embodiments, the first and second wires 212 and 213 may be arranged regardless of the arrangement of the photoelectric conversion regions 110. In other words, the first and second wires 212 and 213 may be provided across the photoelectric conversion regions 110.

The optically-transparent layer 30 may include an anti-reflection layer 329, color filters 303, a micro lens structure 306. The optically-transparent layer 30 may be configured to collect and filter externally incident light and then to provide the light to the photoelectric conversion layer 10.

The semiconductor substrate 100 may include a bulk silicon wafer and an epitaxial layer thereon, and in some embodiments, the bulk silicon wafer and the epitaxial layer may be of a first conductivity type (e.g., p-type). In certain embodiments, the bulk silicon wafer may be removed during a process of fabricating the image sensor, and in this case, the epitaxial layer of the first conductivity type may be used as the semiconductor substrate 100. In certain embodiments, the semiconductor substrate 100 may be a bulk semiconductor wafer, in which a well of the first conductivity type is formed. In certain embodiments, the semiconductor substrate 100 may be one of various substrates including an epitaxial layer of a second conductivity type (e.g., n-type), a bulk silicon wafer of the second conductivity type, or an SOI wafer.

The semiconductor substrate 100 may include a plurality of unit pixels PX defined by a separation pattern 101. The unit pixels PX may be two-dimensionally arranged in two different directions (e.g., first and second directions D1 and D2). In other words, the unit pixels PX may be arranged to form a matrix shape in the first and second directions D1 and D2. When viewed in a plan view, the separation pattern 101 may be provided to completely enclose each of the unit pixels PX. As an example, the separation pattern 101 may have a grid shape. The separation pattern 101 may prevent photocharges, which are produced by light incident into each of the unit pixels PX, from entering neighboring unit pixels PX through a random drift. In other words, the separation pattern 101 may prevent a cross-talk phenomenon from occurring between the unit pixels PX.

The separation pattern 101 may be formed of or include a material, whose refractive index is lower than that of the semiconductor substrate 100 (e.g., silicon). For example, the separation pattern 101 may be formed of or include a silicon oxide layer, a silicon oxynitride layer, a silicon nitride layer, or a poly-silicon layer.

When viewed in a vertical section, the separation pattern 101 may be extended from the first surface 100a of the semiconductor substrate 100 toward the second surface 100b. As an example, the separation pattern 101 may be provided to vertically penetrate the semiconductor substrate 100. In other words, a depth of the separation pattern 101 may be substantially equal to a vertical thickness of the semiconductor substrate 100. A width of the separation pattern 101 may decrease in a direction from the first surface 100a of the semiconductor substrate 100 toward the second surface 100b. For example, a surface of the separation pattern 101 adjacent to the first surface 100a has a first width W1, and an opposite surface of the separation pattern 101 adjacent to the second surface 100b may have a second width W2 smaller than the first width W1. In certain embodiments, the second width W2 may be greater than the first width W1.

The photoelectric conversion regions 110 may be provided in the unit pixels PX, respectively. The photoelectric conversion regions 110 may be impurity regions, which are doped to have the second conductivity type (e.g., n-type) different from that of the semiconductor substrate 100. As an example, the photoelectric conversion regions 110 may be adjacent to the second surface 100b of the semiconductor substrate 100 and may be vertically spaced apart from the first surface 100a. In each of the photoelectric conversion regions 110, there may be a difference in impurity concentration between a first region adjacent to the first surface 100a and a second region adjacent to the second surface 100b. Thus, each of the photoelectric conversion regions 110 may have a non-vanishing potential gradient between the first surface 100a and the second surface 100b.

The semiconductor substrate 100 and the photoelectric conversion regions 110 may constitute photodiodes. In each of the unit pixels PX, the semiconductor substrate 100 of the first conductivity type and the photoelectric conversion region 110 of the second conductivity type may constitute a p-n junction photodiode. Each of the photoelectric conversion regions 110 constituting the photodiode may be configured to generate and accumulate photocharges, and here, an amount of the photocharges may be in proportion to an intensity of an incident light.

A device isolation layer 103 may be provided adjacent to the first surface 100a of the semiconductor substrate 100 to define first active patterns ACT1, second active patterns ACT2, and third active patterns ACT3. The device isolation layer 103 may include a silicon oxide layer, a silicon oxynitride layer, or a silicon nitride layer. As an example, the separation pattern 101 and the device isolation layer 103 may be connected to each other, thereby forming a single body.

Each of the unit pixels PX may include the first active pattern ACT1, the second active pattern ACT2, and the third active pattern ACT3. The first active pattern ACT1, the second active pattern ACT2, and the third active pattern ACT3 may be spaced apart from each other and may have at least two different sizes. The first active pattern ACT1 may be provided between the second active pattern ACT2 and the third active pattern ACT3.

The transfer transistor TX including the transfer gate TG may be provided on the first active pattern ACT1 of each of the unit pixels PX. The transfer gate TG may be provided on the first active pattern ACT1. The transfer gate TG may include a lower portion, which is inserted into the semiconductor substrate 100, and an upper portion, which is connected to the lower portion and is formed to protrude above the first surface 100a of the semiconductor substrate 100. A gate dielectric layer GI may be interposed between the transfer gate TG and the semiconductor substrate 100. The floating diffusion region FD may be formed in a region of the first active pattern ACT1 that is located at a side of the transfer gate TG. The floating diffusion region FD may be doped to have the second conductivity type (e.g., the n type) that is different from that of the semiconductor substrate 100.

The drive transistor DX and the selection transistor SX may be provided on the second active pattern ACT2 of each of the unit pixels PX. The drive transistor DX may include a drive gate SFG, and the selection transistor SX may include a selection gate SG. The drive gate SFG and the selection gate SG may be provided on the second active pattern ACT2. The reset transistor RX including a reset gate RG may be provided on the third active pattern ACT3 of each of the unit pixels PX. The reset gate RG may be provided on the third active pattern ACT3. A gate dielectric layer may be interposed between each of the drive, selection, and reset gates SFG, SG, and RG and the semiconductor substrate 100. Impurity regions may be provided in upper regions of the active patterns ACT2 and ACT3, which are located at both sides of each of the drive, selection, and reset gates SFG, SG, and RG. For example, the impurity regions may be doped to have the second conductivity type (e.g., n-type) different from that of the semiconductor substrate 100.

Figure 5A:
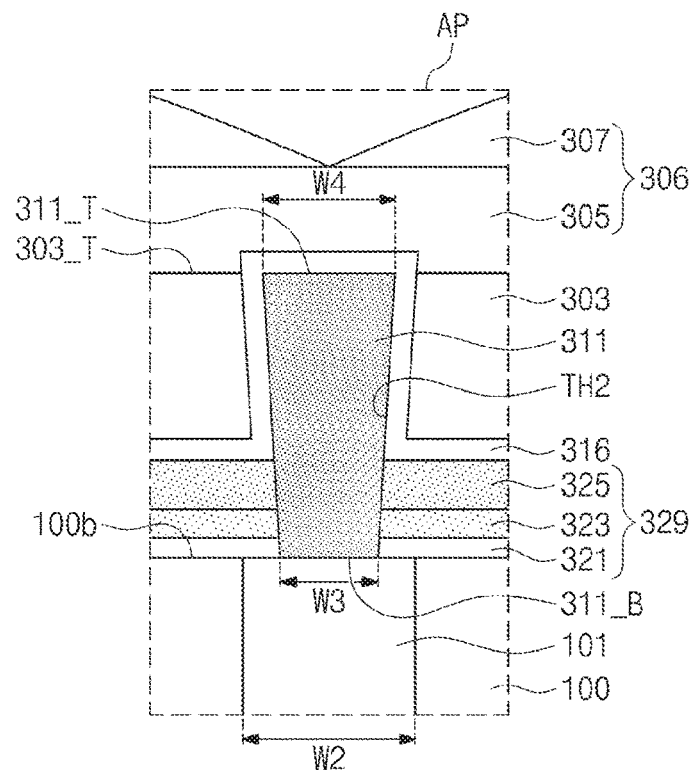
FIG. 5A is an enlarged view of a region AP of FIG. 4.

The anti-reflection layer 329 may be provided on the second surface 100b of the semiconductor substrate 100. The anti-reflection layer 329 may include a first sub layer 321, a second sub layer 323, and a third sub layer 325, which are sequentially stacked on the second surface 100b, as shown in FIG. 5A. The first sub layer 321, the second sub layer 323, and the third sub layer 325 may differ from each other in their materials. The first sub layer 321 may be used as a buffer layer. As an example, the first sub layer 321 may be formed of or include aluminum oxide. The second sub layer 323 may be used as a fixed charge layer, in which negative charges for suppressing a dark current are included. As an example, the second sub layer 323 may be formed of or include at least one of hafnium oxide, tantalum oxide, or titanium oxide. The third sub layer 325 may be formed of or include silicon oxide (e.g., tetraethyl orthosilicate (TEOS)). As an example, a thickness of the third sub layer 325 may be greater than that of the second sub layer 323. The thickness of the second sub layer 323 may be greater than that of the first sub layer 321.

The color filters 303 may be provided on the anti-reflection layer 329. The color filters 303 may be provided on the unit pixels PX, respectively. Each of the color filters 303 may be or include one of green, red and blue color filters. In certain embodiments, each of the color filters 303 may be or include one of cyan, magenta, and yellow filters.

A barrier layer, which may also be referred to as a protection layer 316, may be provided between the anti-reflection layer 329 and the color filters 303. The protection layer 316 may protect the photoelectric conversion layer 10 and the interconnection layer 20 from harmful external factors (e.g., moisture). As an example, the protection layer 316 may be formed of or include aluminum oxide. A thickness of the protection layer 316 may be smaller than that of the second sub layer 323.

The optically-transparent layer 30 may include a fence pattern 311 separating the color filters 303 from each other. The fence pattern 311 may be configured to reflect light, which is incident in a direction inclined to the second surface 100b of the semiconductor substrate 100, and this reflection may allow the incident light to be incident into an intended one of the unit pixels PX, not a neighboring pixel. The color filters 303 may be separated from each other by the fence pattern 311 interposed therebetween (in particular, by an upper portion of the fence pattern 311) and may be separately provided on respective unit pixels PX. In other words, the color filters 303 provided on adjacent ones of the unit pixels PX may not be in contact with each other and may be provided in an isolated shape. As an example, a top surface 311_T of the fence pattern 311 may be located at substantially the same level as a top surface 303_T of the color filters 303, but the inventive concept is not limited to this example. In the present embodiment, a top surface of the protection layer 316 may protrude above the top surface 303_T of the color filters 303 or in a third direction D3. When viewed in a plan view, the fence pattern 311 may be provided to completely enclose each of the unit pixels PX. As an example, the fence pattern 311 may have a grid shape.

A lower portion of the fence pattern 311 may be buried in the anti-reflection layer 329. As an example, the fence pattern 311 may be provided to penetrate the anti-reflection layer 329. In other words, the fence pattern 311 may be provided to penetrate the first sub layer 321, the second sub layer 323, and the third sub layer 325. Thus, each of the first sub layer 321, the second sub layer 323, and the third sub layer 325 may be provided in an isolated shape on each unit pixel PX. In other words, the anti-reflection layer 329 may include anti-reflection patterns, each of which may be provided on a corresponding one of the pixels PX to have an isolated shape. As an example, a bottom surface 311_B of the fence pattern 311 may be in contact with the top surface of the separation pattern 101.

An upper width W4 of the fence pattern 311 may be greater than a lower width W3. As an example, a width of the fence pattern 311 may gradually decrease in a direction from the top surface 311_T toward the bottom surface 311_B. As an example, the upper width W4 of the fence pattern 311 may be greater than the lower width W3 by about 3% to 15%. The lower width W3 of the fence pattern 311 may be smaller than the second width W2 (hereinafter, an upper width) of the separation pattern 101. As an example, the upper width W4 of the fence pattern 311 may be smaller than the upper width W2 of the separation pattern 101.

The protection layer 316 may be extended from a region between the color filters 303 and the anti-reflection layer 329 to cover a top surface of the fence pattern 311. The protection layer 316 may be in contact with an upper side surface of the fence pattern 311. The fence pattern 311 may be an insulating pattern. The fence pattern 311 may include a material whose refractive index is lower than that of the semiconductor substrate 100 (e.g., silicon). As an example, the fence pattern 311 may have a refractive index of about 1.3 or lower. For example, the fence pattern 311 may be a polymer layer, in which silica nanoparticles are included.

The micro lens structure 306 may be provided on the color filters 303. The micro lens structure 306 may include a planarization layer 305, which is in contact with the color filters 303, and micro lenses 307, which are provided on the planarization layer 305 and on respective ones of the unit pixels PX. The planarization layer 305 may include an organic layer. In certain embodiments, the planarization layer 305 may include a silicon oxide layer or a silicon oxynitride layer.

Each of the micro lenses 307 may have a convex shape of focusing the incident light on the unit pixel PX. Each of the micro lenses 307 may be overlapped with a corresponding one of the photoelectric conversion regions 110, when viewed in a plan view.

According to some embodiments of the inventive concept, the fence pattern 311 may include the upper portion separating the color filters 303 from each other and the lower portion buried in the anti-reflection layer 329. This structure of the fence pattern 311 may allow light, which is incident at an inclined angle, to be properly incident into a corresponding one of the unit pixels PX, and thus, it may be possible to reduce optical loss in the color filters 303 and the anti-reflection layer 329 and to suppress a cross-talk issue. Accordingly, it may be possible to improve sensing characteristics (e.g., sensitivity and signal-to-noise ratio (SNR)) of the image sensor.

FIGS. 5B to 5J are enlarged sectional views, each of which illustrates a region (e.g., the region AP of FIG. 4) of an image sensor according to some embodiments of the inventive concept. For concise description, a previously described element may be identified by a similar or identical reference number without repeating an overlapping description thereof.

Figure 5B:
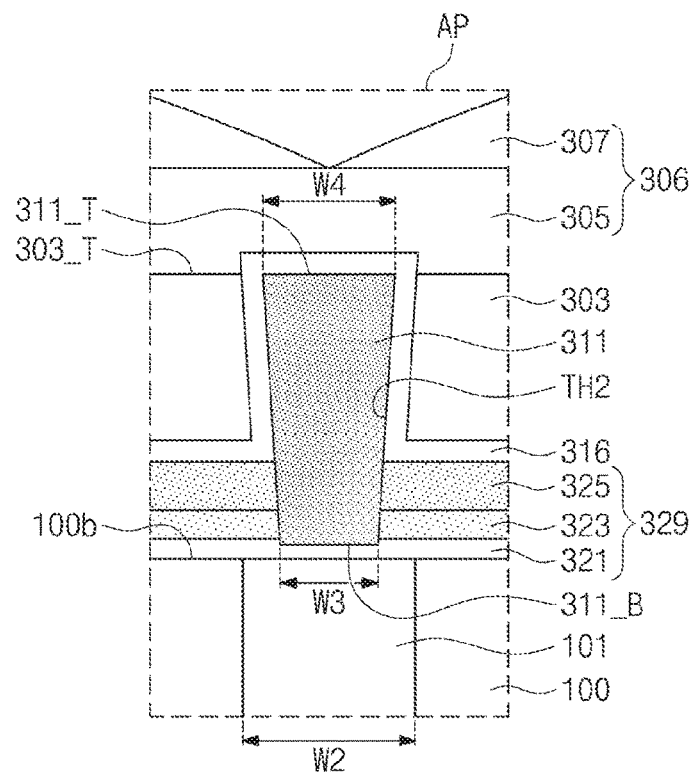
FIGS. 5B to 5J are enlarged sectional views, each of which illustrates a region (e.g., the region AP of FIG. 4) of an image sensor according to some embodiments of the inventive concept.

Referring to FIGS. 4 and 5B, the anti-reflection layer 329 may include the first sub layer 321, the second sub layer 323, and the third sub layer 325, which are sequentially stacked on the second surface 100b, and the fence pattern 311 may be provided to penetrate the second sub layer 323 and the third sub layer 325, but not the first sub layer 321. Thus, each of the second sub layer 323 and the third sub layer 325 may be provided to have an isolated shape on a corresponding one of the unit pixels PX, and the first sub layer 321 may cover a plurality of the pixels PX. The bottom surface 311_B of the fence pattern 311 may be higher than the bottom surface of the first sub layer 321. The bottom surface 311_B of the fence pattern 311 may be spaced apart from the separation pattern 101 with the first sub layer 321 interposed therebetween.

Figure 5C:
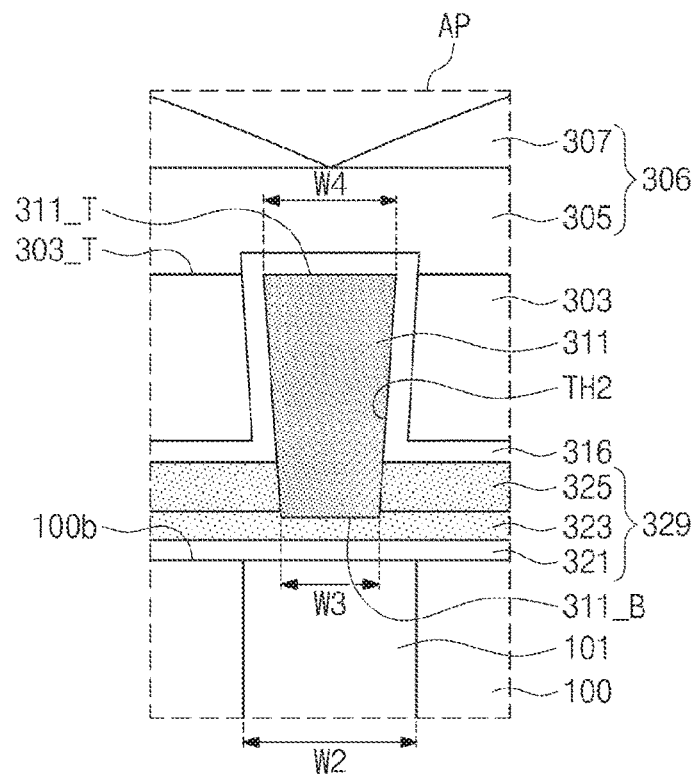

Referring to FIGS. 4 and 5C, the anti-reflection layer 329 may include the first sub layer 321, the second sub layer 323, and the third sub layer 325, which are sequentially stacked on the second surface 100b, and the fence pattern 311 may be provided to penetrate the third sub layer 325, but not the first sub layer 321 and the second sub layer 323. Thus, the third sub layer 325 may be provided to have an isolated shape on a corresponding one of the unit pixels PX, and the first sub layer 321 and the second sub layer 323 may cover a plurality of the pixels PX. The bottom surface 311_B of the fence pattern 311 may be higher than the bottom surface of the second sub layer 323. The bottom surface 311_B of the fence pattern 311 may be spaced apart from the separation pattern 101 with the first sub layer 321 and the second sub layer 323 interposed therebetween.

Figure 5D:
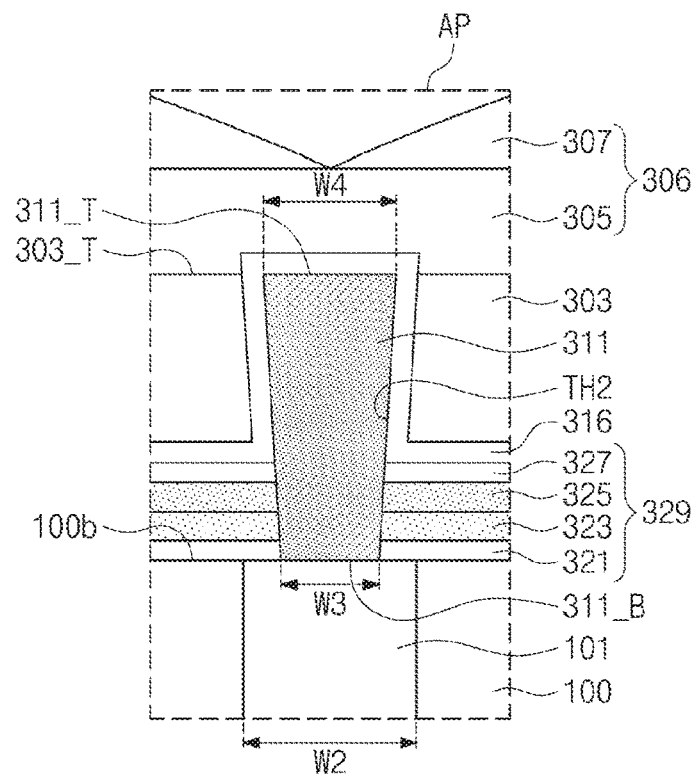

Referring to FIGS. 4 and 5D, the anti-reflection layer 329 may include the first sub layer 321, the second sub layer 323, the third sub layer 325, and a fourth sub layer 327, which are sequentially stacked on the second surface 100b. The fourth sub layer 327 may be formed of or include the same material as the second sub layer 323. As an example, the fourth sub layer 327 may be formed of or include at least one of hafnium oxide, tantalum oxide, or titanium oxide. The fourth sub layer 327 may be thinner than the second sub layer 323, but the inventive concept is not limited to this example. The fourth sub layer 327 may be thicker than the first sub layer 321. The bottom surface 311_B of the fence pattern 311 is illustrated to have a shape similar to that of FIG. 5A but in certain embodiments, the bottom surface 311_B may have a shape similar to that of FIG. 5B or 5C.

Figure 5E:
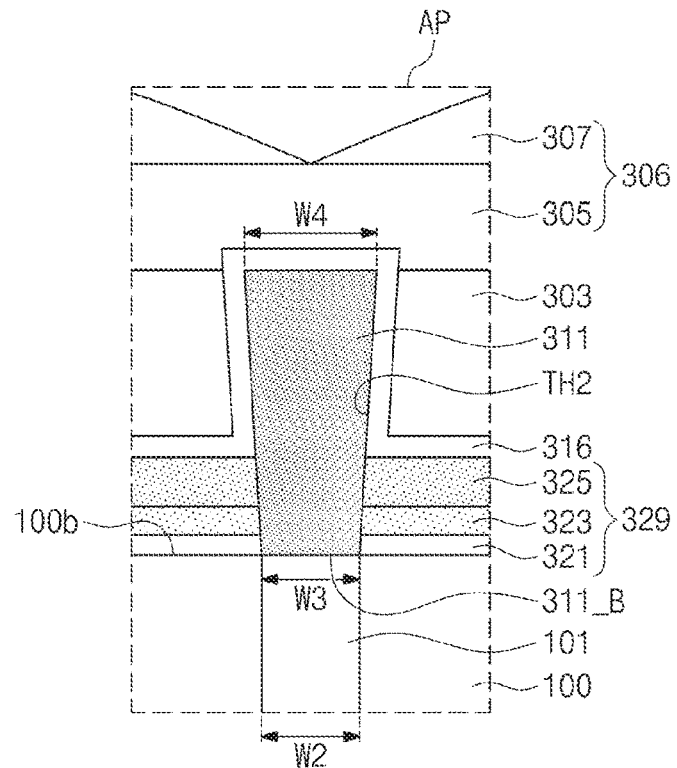

Referring to FIGS. 4 and 5E, the lower width W3 of the fence pattern 311 may be substantially equal to the upper width W2 of the separation pattern 101. A side surface of the fence pattern 311 may be aligned to a side surface of the separation pattern 101, as shown in FIG. 5E, but the inventive concept is not limited to this example. For example, in certain embodiments, the upper width W4 of the fence pattern 311 may be greater than the upper width W2 of the separation pattern 101.

Figure 5F:
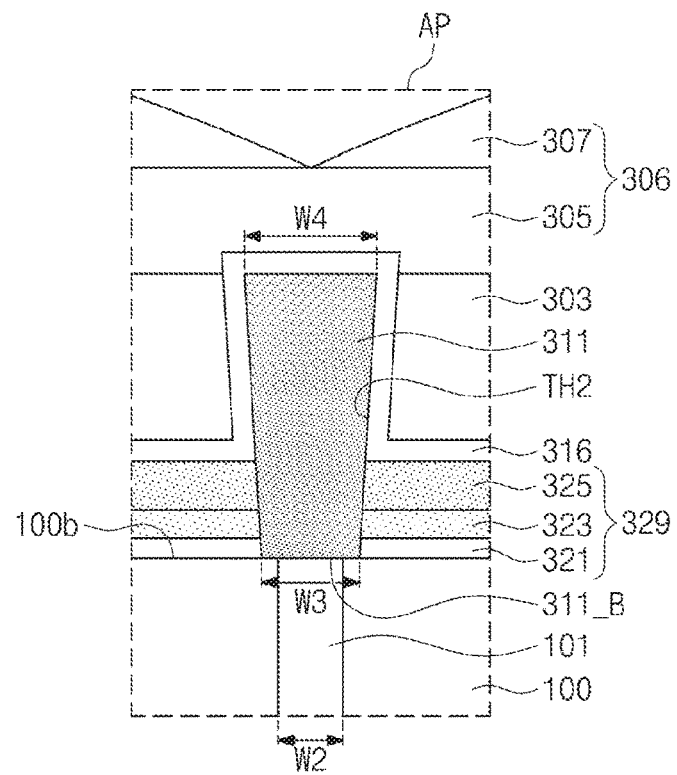

Referring to FIGS. 4 and 5F, the lower width W3 of the fence pattern 311 may be greater than the upper width W2 of the separation pattern 101. In addition, the upper width W4 of the fence pattern 311 may be greater than the upper width W2 of the separation pattern 101.

Figure 5G:
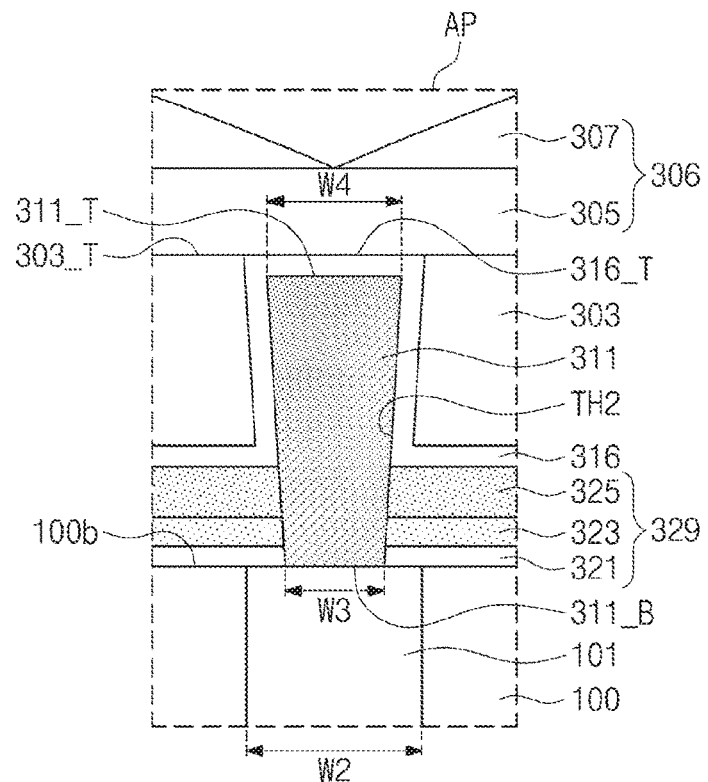

Referring to FIGS. 4 and 5G, a top surface 316_T of the protection layer 316 may be located at substantially the same level as the top surface 303_T of the color filter 303. As an example, the top surface 311_T of the fence pattern 311 may be lower than the top surface 303_T of the color filter 303.

Figure 5H:
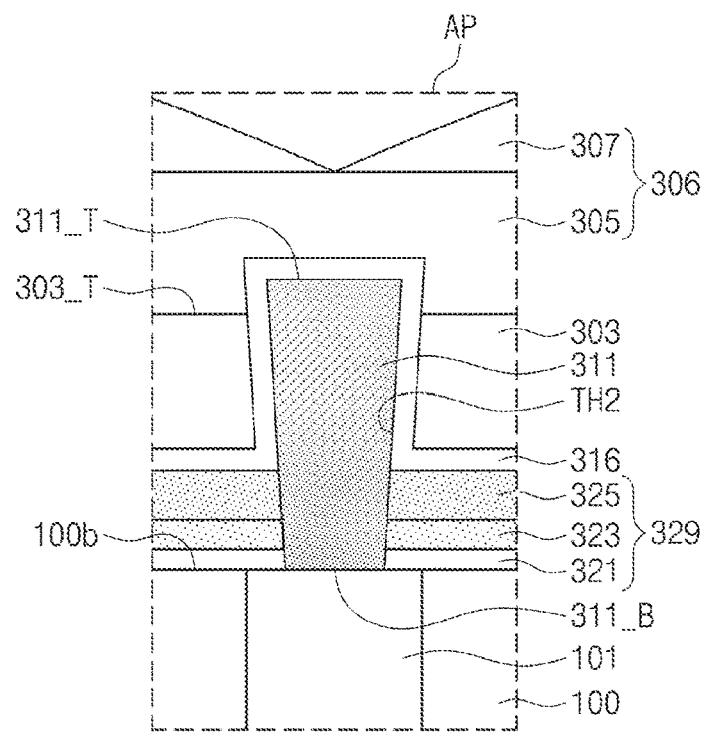

Referring to FIGS. 4 and 5H, the top surface 311_T of the fence pattern 311 may be higher than the top surface 303_T of the color filter 303.

Figure 5I:
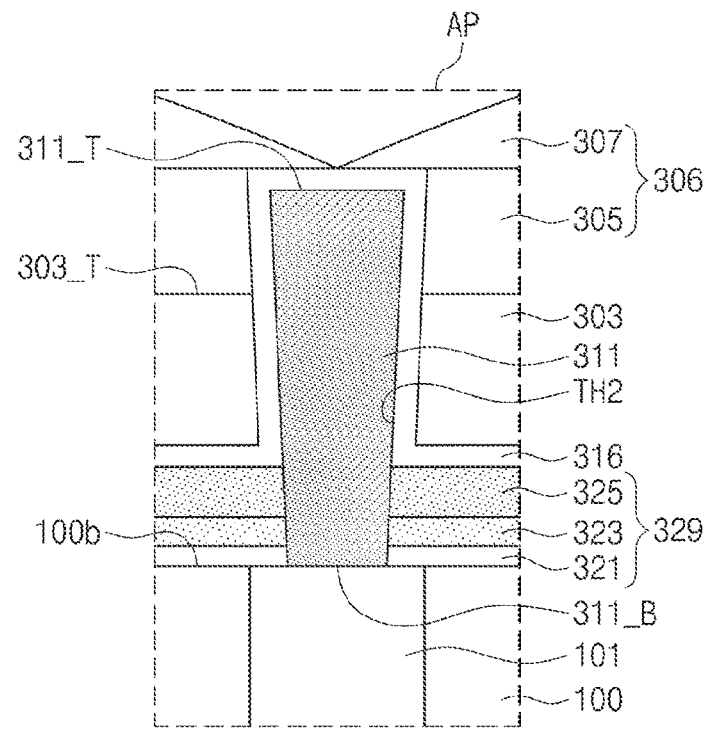

Referring to FIGS. 4 and 5I, the fence pattern 311 may include an upper portion inserted into the planarization layer 305. The planarization layer 305 may be divided by the fence pattern 311 and the protection layer 316 to include a plurality of patterns, each of which has an isolated shape on a corresponding one of the unit pixels PX.

Figure 5J:
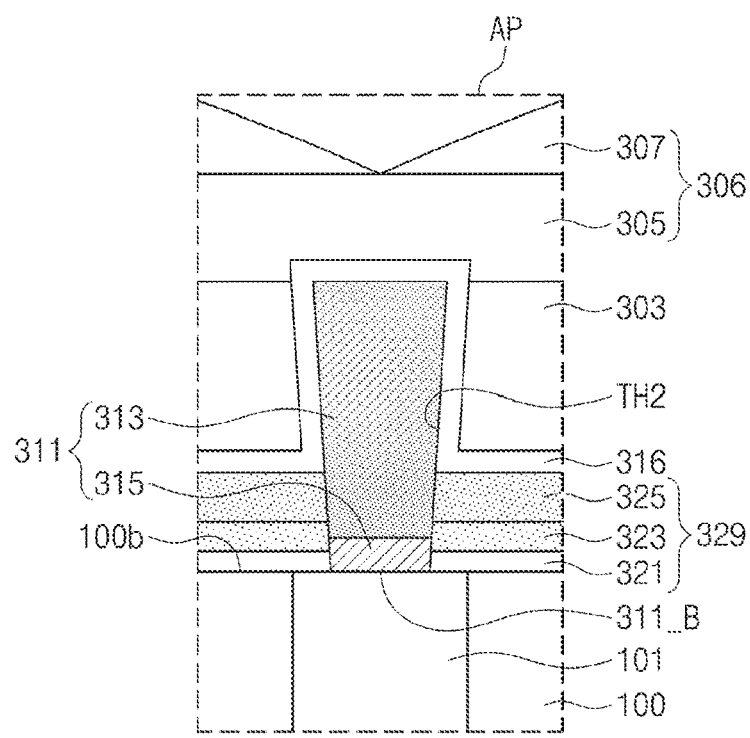

Referring to FIGS. 4 and 5J, the fence pattern 311 may include an insulating fence pattern 313 and a conductive fence pattern 315 thereunder. A width of the fence pattern 311 may gradually decrease in a direction from a top surface of the insulating fence pattern 313 toward a bottom surface of the conductive fence pattern 315. The conductive fence pattern 315 may be formed of or include, for example, tungsten or titanium. The conductive fence pattern 315 may be thicker than the first sub layer 321.

FIGS. 6 to 9 are sectional views, which are taken along line I-I' of FIG. 3 to illustrate a method of fabricating an image sensor according to some embodiments of the inventive concept.

Figure 6:
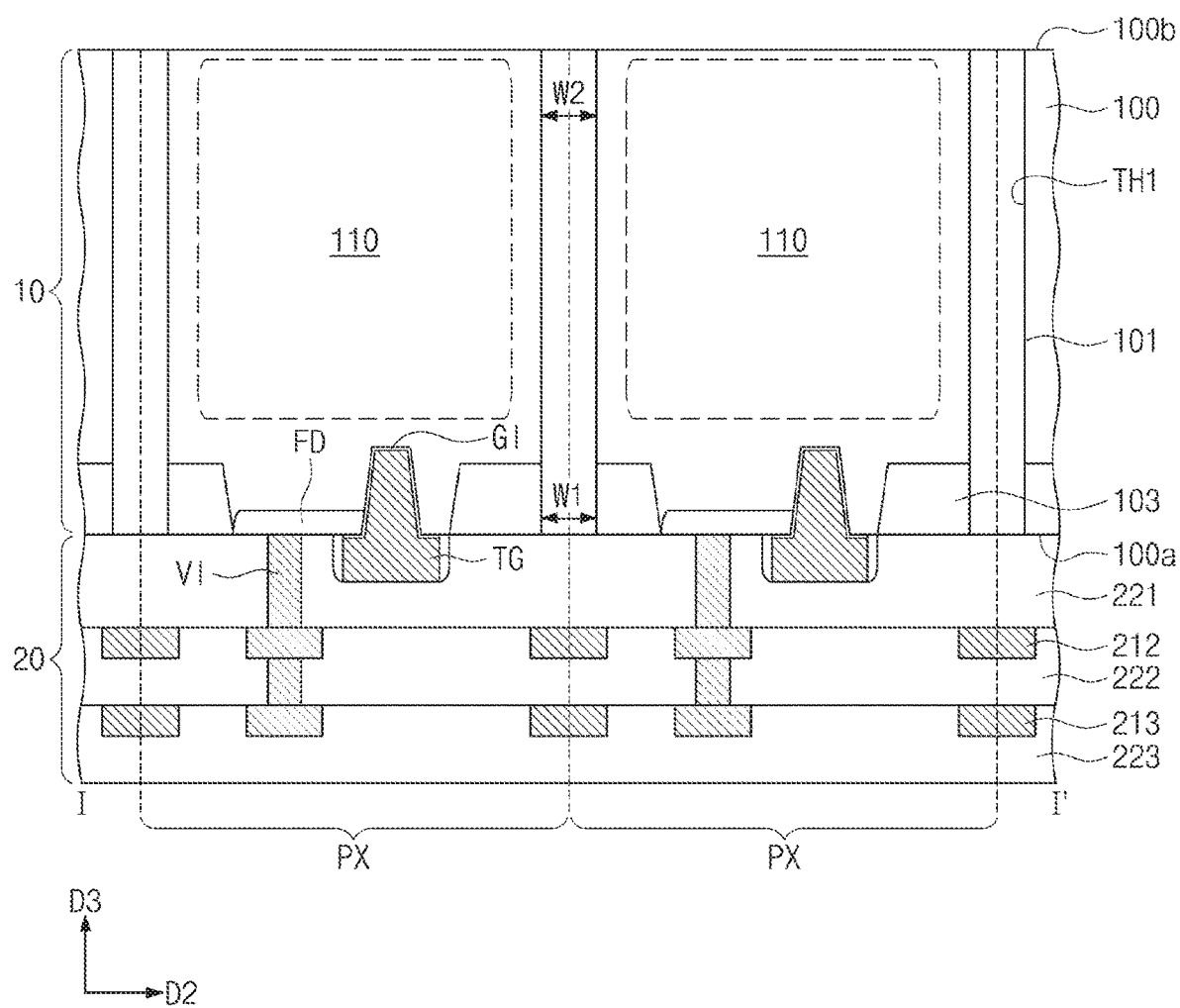
FIGS. 6 to 9 are sectional views, which are taken along line I-I' of FIG. 3 to illustrate a method of fabricating an image sensor according to some embodiments of the inventive concept.

Referring to FIGS. 3 and 6, the photoelectric conversion layer 10 and the interconnection layer 20 may be formed. A first trench TH1 for forming the separation pattern 101 may be formed by performing an etching process on the semiconductor substrate 100 from the first surface 100a or from the second surface 100b. If the etching process starts from the first surface 100a, the first trench TH1 and the separation pattern 101 may be formed in advance before the formation of the interconnection layer 20. In this case, the first width W1 may be greater than the second width W2. If the etching process starts from the second surface 100b, the first trench TH1 and the separation pattern 101 may be formed after the formation of the interconnection layer 20. In this case, the second width W2 may be greater than the first width W1. A back-grinding process may be performed on the second surface 100b of the semiconductor substrate 100 to remove a portion of the semiconductor substrate 100.

Figure 7:
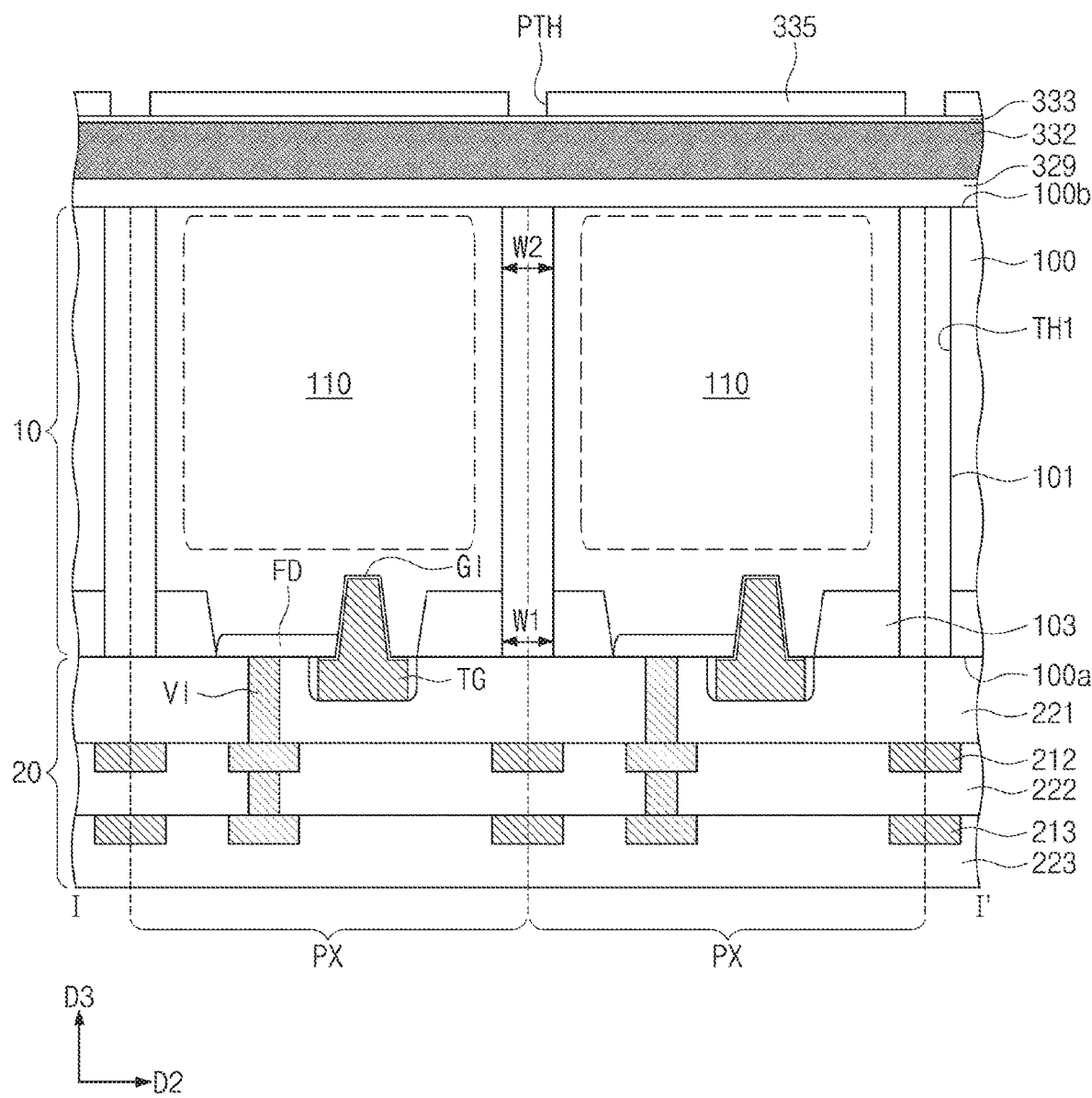

Referring to FIGS. 3 and 7, the anti-reflection layer 329, a sacrificial layer 332, an interface insulating layer 333, and a mask pattern 335 may be sequentially formed on the second surface 100b of the semiconductor substrate 100. The anti-reflection layer 329 may be substantially the same as that described with reference to FIGS. 5A to 5J. The sacrificial layer 332 may be formed of or include a material having a sufficiently high etch selectivity with respect to the anti-reflection layer 329. As an example, the sacrificial layer 332 may be formed of a material whose carbon content is at least 70 wt %. The sacrificial layer 332 may include, for example, at least one of spin-on-hardmask (SOH) materials. The sacrificial layer 332 may be formed to be thicker than the anti-reflection layer 329.

The interface insulating layer 333 may be a silicon oxide layer. The mask pattern 335 may include a photoresist layer. The mask pattern 335 may include a preliminary trench PTH, which is formed to expose a top surface of the interface insulating layer 333.

Figure 8:
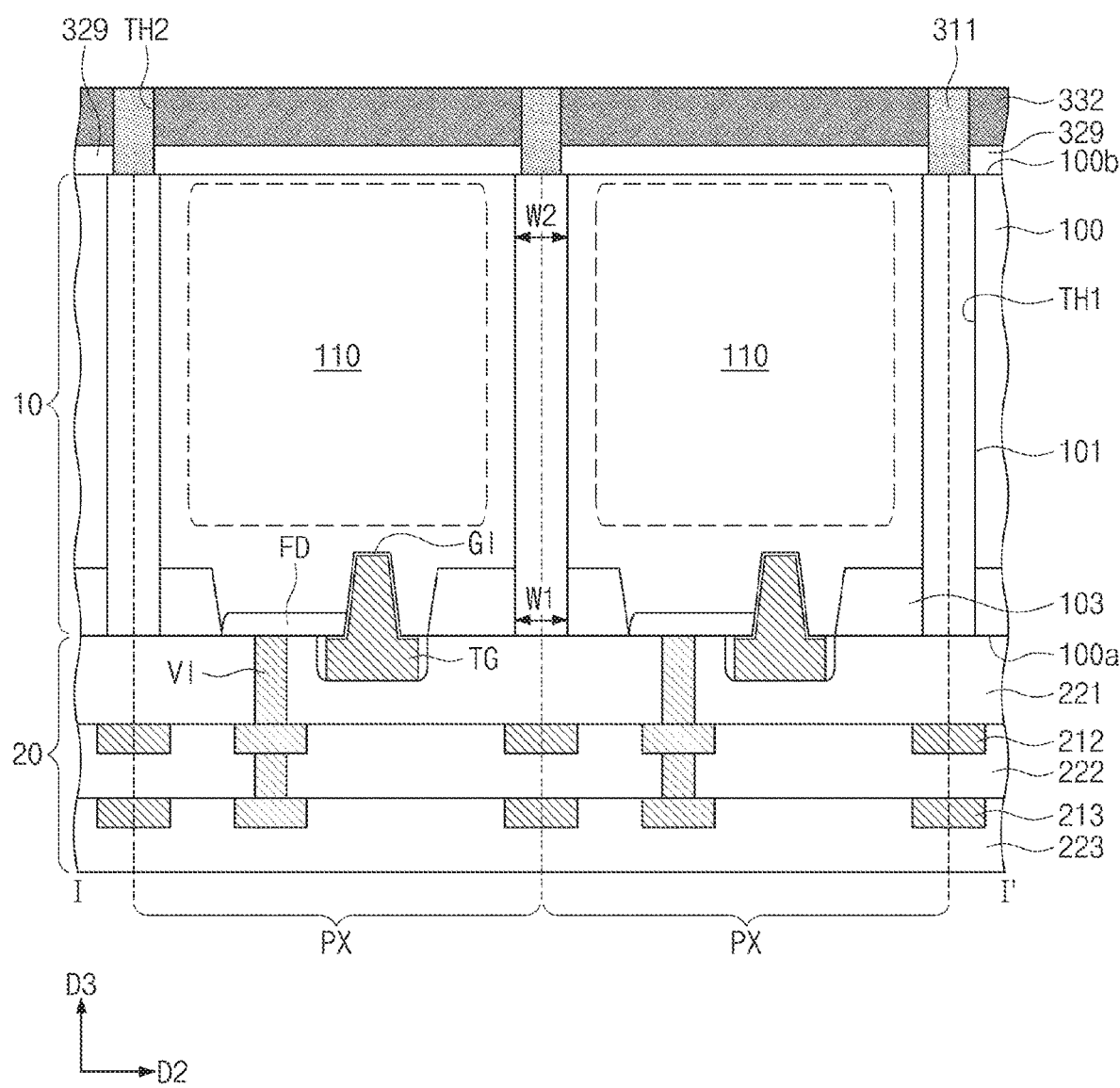

Referring to FIGS. 3 and 8, the interface insulating layer 333, the sacrificial layer 332, and the anti-reflection layer 329 may be patterned using the mask pattern 335. Thus, a second trench TH2 may be formed to penetrate the sacrificial layer 332 and the anti-reflection layer 329. As an example, the second trench TH2 may be formed to expose the separation pattern 101. The shape and depth of the second trench TH2 may be variously changed, as shown in FIGS. 5A to 5J. The fence pattern 311 may be formed to fill the second trench TH2. In other words, the sacrificial layer 332 and the anti-reflection layer 329 may be used as a mold for forming the fence pattern 311. The fence pattern 311 may be formed by a spin coating method. As an example, the formation of the fence pattern 311 may include supplying a fluidic precursor material to fill the second trench TH2 and performing a baking process to thermally cure the precursor material. If necessary, an etch-back process may be further performed on the precursor material.

In certain embodiments, the formation of the fence pattern 311 may include forming an insulating layer to fill the second trench TH2 and performing an etch-back process on the insulating layer. During the formation of the fence pattern 311, the interface insulating layer 333 may be removed and a top surface of the sacrificial layer 332 may be exposed.

Figure 9:
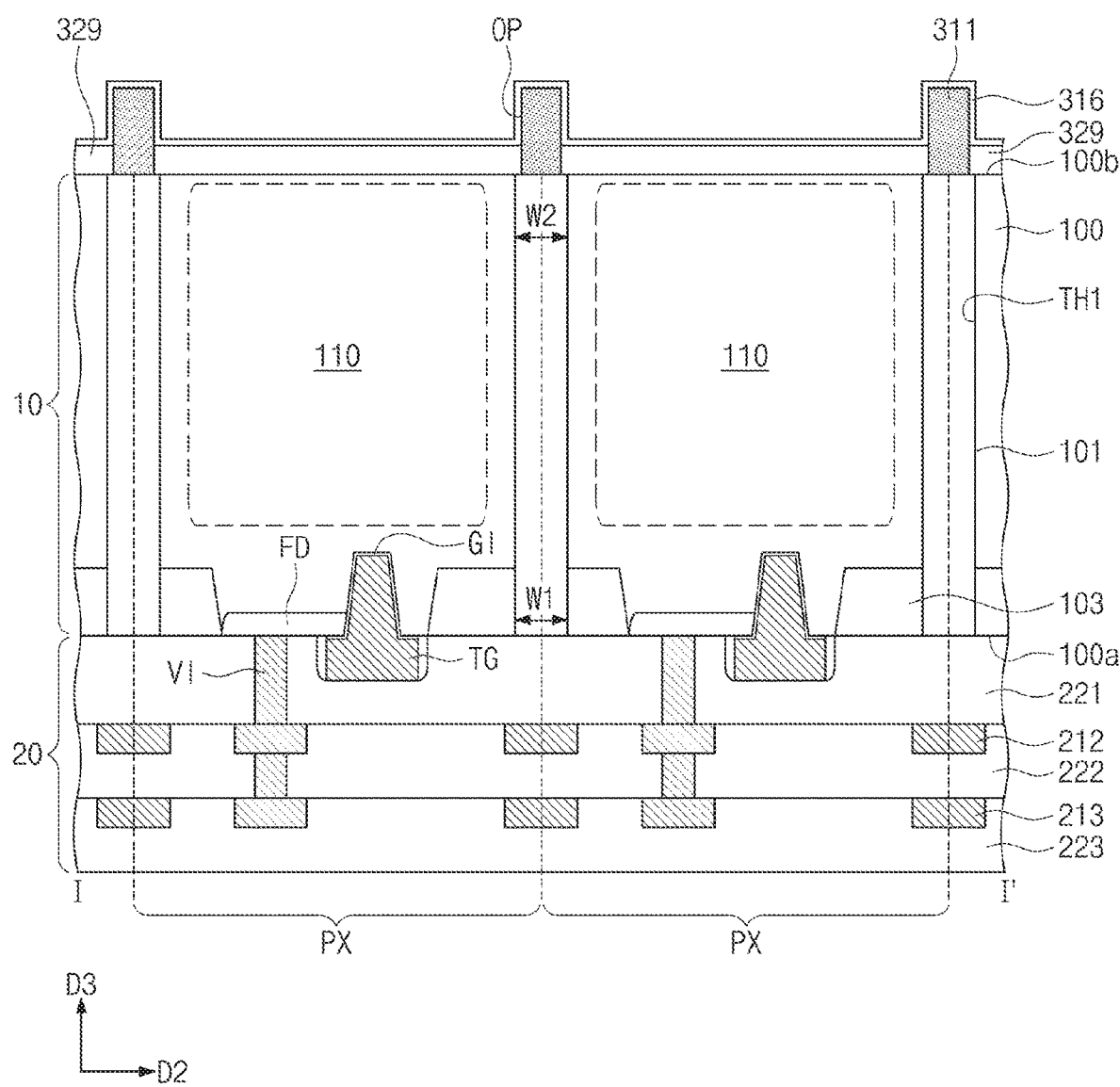

Referring to FIGS. 3 and 9, the sacrificial layer 332 may be selectively removed to expose the anti-reflection layer 329, and then the protection layer 316 may be formed to conformally cover the anti-reflection layer 329. The sacrificial layer 332 may be removed by an ashing process using oxygen. As a result of the removal of the sacrificial layer 332, openings OP, which are defined by side surfaces of the fence patterns 311 and the top surface of the anti-reflection layer 329, may be formed. The protection layer 316 may be formed to cover the exposed side and top surfaces of the fence pattern 311 and to the exposed top surface of the anti-reflection layer 329. As an example, the sacrificial layer 332 may be formed by a chemical vapor deposition process.

Referring back to FIGS. 3 and 4, the color filters 303 may be formed to fill the openings OP of FIG. 9. Thereafter, the micro lens structure 306 may be formed on the color filters 303, and the fabrication of the optically-transparent layer 30 may be finished.

Figure 10:
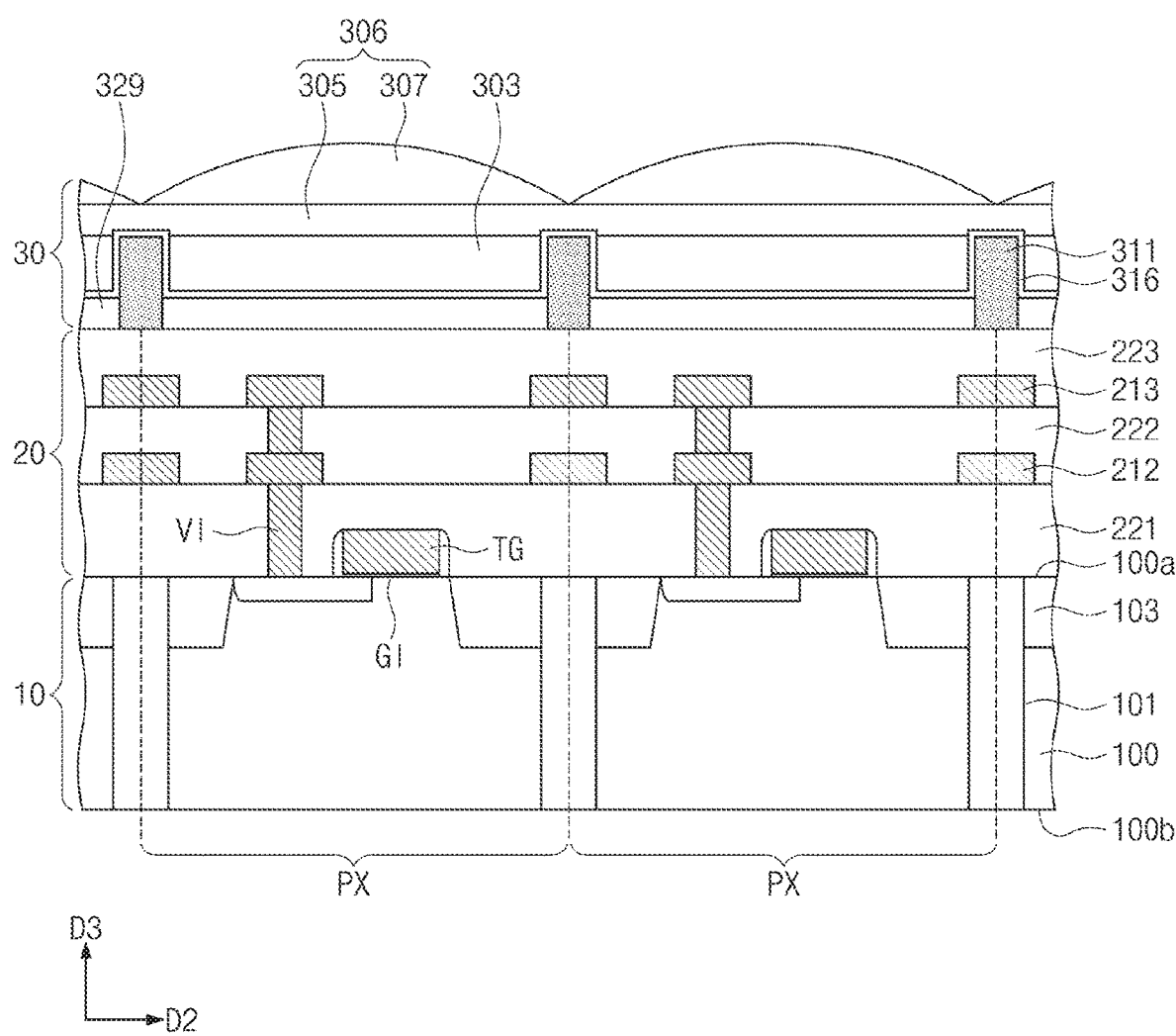
FIG. 10 is a sectional view illustrating an image sensor according to some embodiments of the inventive concept.

FIG. 10 is a sectional view illustrating an image sensor according to some embodiments of the inventive concept. For concise description, a previously described element may be identified by a similar or identical reference number without repeating an overlapping description thereof. In an image sensor according to the present embodiments, the interconnection layer 20 may be interposed between the photoelectric conversion layer 10 and the optically-transparent layer 30. The fence pattern 311 and the anti-reflection layer 329 may be in contact with the third interlayered insulating layer 223 of the interconnection layer 20.

Figure 11:
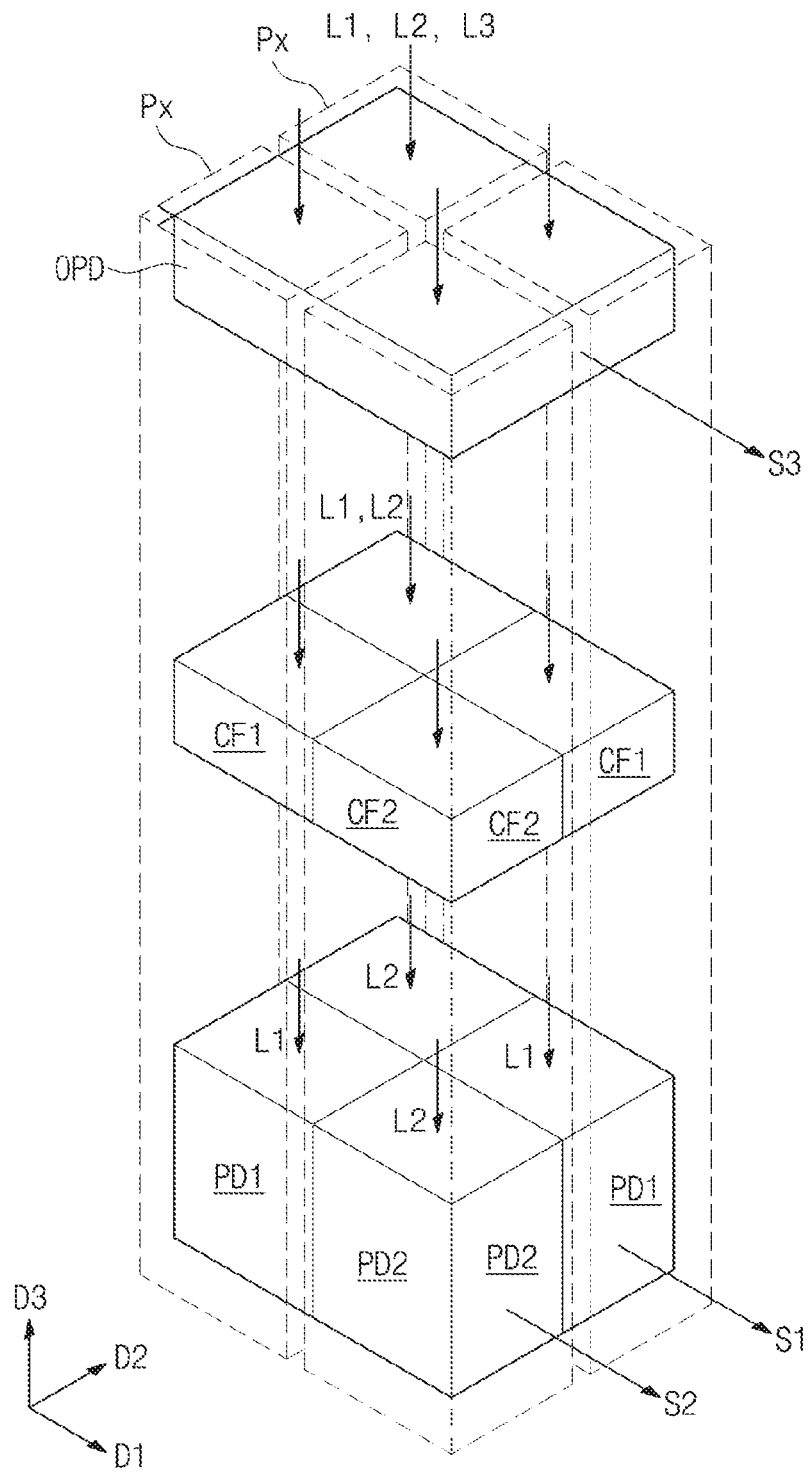
FIG. 11 is a block diagram illustrating an image sensor according to some embodiments of the inventive concept.

FIG. 11 is a block diagram illustrating an image sensor according to some embodiments of the inventive concept. Referring to FIG. 11, an image sensor may include a plurality of unit pixels PX, which are two-dimensionally arranged in two different directions (e.g., the first and second directions D1 and D2). Each of the unit pixels PX of the image sensor may include at least two photoelectric conversion devices, which are stacked in a third direction D3 perpendicular to the first and second directions D1 and D2. Each of the unit pixels PX may include a first or second photoelectric conversion device PD1 or PD2, a first or second color filter CF1 or CF2, and an organic photoelectric conversion device OPD.

The first and second photoelectric conversion devices PD1 and PD2 may be provided in a semiconductor substrate and may be arranged in a matrix shape. The organic photoelectric conversion devices OPD may be stacked on the first and second photoelectric conversion devices PD1 and PD2, respectively. In other words, each of the organic photoelectric conversion devices OPD may be overlapped with a corresponding one of the first and second photoelectric conversion devices PD1 and PD2, when viewed in a plan view. The first color filters CF1 may be respectively provided between the first photoelectric conversion devices PD1 and the organic photoelectric conversion devices OPD, and the second color filters CF2 may be respectively provided between the second photoelectric conversion devices PD2 and the organic photoelectric conversion devices OPD.

In some embodiments, incident lights L1, L2, and L3 of first to third wavelength bands may be incident into the organic photoelectric conversion devices OPD of the unit pixels PX. Different lights with different wavelength bands may be incident into the first and second photoelectric conversion devices PD1 and PD2 and the organic photoelectric conversion device OPD, respectively, and in each of the first and second photoelectric conversion devices PD1 and PD2 and the organic photoelectric conversion device OPD, an amount of generated photocharges may be in proportion to an intensity of the light incident thereto.

The first photoelectric conversion device PD1 may generate first photocharges, when the incident light L1 of the first wavelength band is incident into the first photoelectric conversion device PD1. The second photoelectric conversion device PD2 may generate second photocharges, when the incident light L2 of the second wavelength band is incident into the second photoelectric conversion device PD2. The organic photoelectric conversion device OPD may generate third photocharges, when the incident light L3 of the third wavelength band is incident into the organic photoelectric conversion device OPD. Here, the first wavelength band may be longer than the third wavelength band, and the second wavelength band may be shorter than the third wavelength band. For example, the incident light L1 of the first wavelength band may be red, the incident light L2 of the second wavelength band may be blue, and the incident light L3 of the third wavelength band may be green.

The incident light L1 of the first wavelength band may pass through the organic photoelectric conversion device OPD and the first color filter CF1 and may be incident into the first photoelectric conversion device PD1, and the incident light L2 of the second wavelength band may pass through the organic photoelectric conversion device OPD and the second color filter CF2 and may be incident into the second photoelectric conversion device PD2. The incident light L3 of the third wavelength band may be incident into the organic photoelectric conversion device OPD.

A first pixel signal S1 corresponding to the incident light L1 of the first wavelength band may be output from the unit pixel Px including the first photoelectric conversion device PD1, and a second pixel signal S2 corresponding to the incident light L2 of the second wavelength band may be output from the unit pixel PX including the second photoelectric conversion device PD2. In addition, a third pixel signal S3 corresponding to the incident light L3 of the third wavelength band may be output from the organic photoelectric conversion device OPD of the unit pixel PX.

Figure 12:
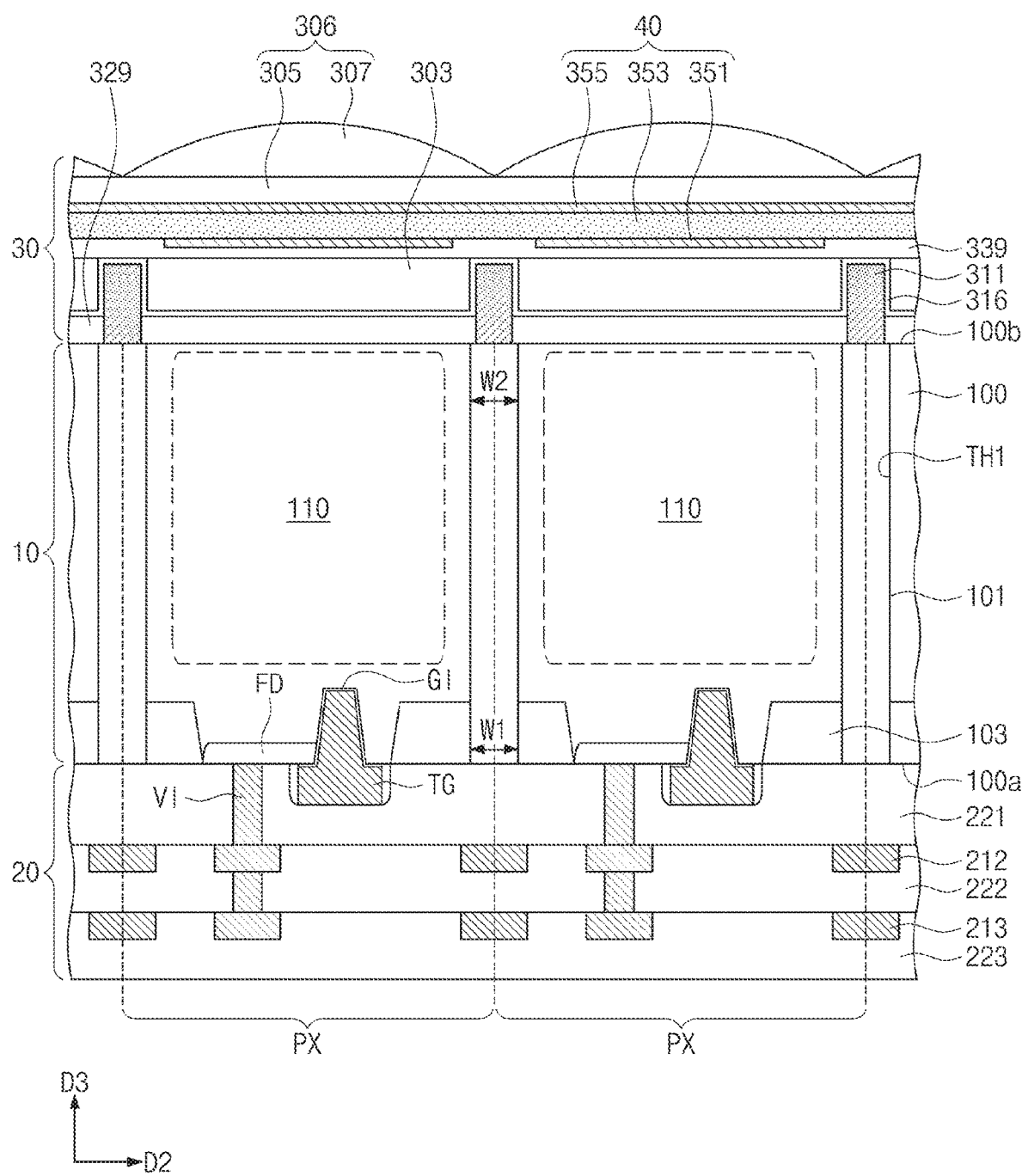
FIG. 12 is a sectional view of an image sensor according to the block diagram of FIG. 11.

FIG. 12 is a sectional view of an image sensor according to the block diagram of FIG. 11. An image sensor according to the present embodiment may include the first photoelectric conversion layer 10 and the optically-transparent layer 30, and a second photoelectric conversion layer 40 may be provided in the optically-transparent layer 30. The second photoelectric conversion layer 40 may include upper and lower electrodes 355 and 351 and an organic photoelectric conversion layer 353 therebetween.

The lower electrodes 351 may be provided on the unit pixels PX, respectively, and may be spaced apart from each other. The lower electrodes 351 may be formed of or include a transparent conductive material. For example, the lower electrodes 351 may include at least one material selected from the group consisting of indium tin oxide (ITO), indium zinc oxide (IZO), zinc oxide (ZnO), SnO2, antimony-doped tin oxide (ATO), al-doped zinc oxide (AZO), gallium-doped zinc oxide (GZO), TiO2, or fluorine-doped tin oxide (FTO). The lower electrodes 351 may be provided in a fourth interlayered insulating layer 339 and may be spaced apart from the color filters 303 with the fourth interlayered insulating layer 339 interposed therebetween. The lower electrodes 351 may be connected to penetration electrodes (not shown) in the semiconductor substrate 100.

The organic photoelectric conversion layer 353 may be configured to selectively absorb a light beam in a specific wavelength band and to perform a photoelectric conversion to such light. The organic photoelectric conversion layer 353 may include a p-type organic semiconductor material and an n-type organic semiconductor material constituting a pn junction. In certain embodiments, the organic photoelectric conversion layer 353 may include quantum dot or chalcogenide. In certain embodiments, the upper electrode 355 may be formed of or include a transparent conductive material and may be provided to cover all of the unit pixels PX.

According to some embodiments of the inventive concept, an image sensor is configured to suppress optical loss and cross-talk issues. Accordingly, the image sensor may have improved sensitivity and signal-to-noise ratio (SNR) characteristics.

While example embodiments of the inventive concepts have been particularly shown and described, it will be understood by one of ordinary skill in the art that variations in form and detail may be made therein without departing from the spirit and scope of the attached claims.

What is claimed is:

1. An image sensor, comprising:
    a plurality of unit pixels;
    a color filter array provided on the plurality of unit pixels, the color filter array comprising color filters;
    an anti-reflection layer disposed between the plurality of unit pixels and the color filter array; and
    a fence pattern including a lower portion buried in the anti-reflection layer and an upper portion separating the color filters from each other,
    a protection layer disposed between the anti-reflection layer and the color filters, the protection layer covering a top surface of the anti-reflection layer and a side surface of the fence pattern,
    wherein a width of the upper portion of the fence pattern is greater than a width of the lower portion,
    wherein the lower portion and the upper portion of the fence pattern are insulating layers.

2. The image sensor of claim 1, wherein the anti-reflection layer comprises a first sub layer, a second sub layer, and a third sub layer, which are sequentially stacked on the plurality of unit pixels, and
    the fence pattern penetrates the third sub layer.

3. The image sensor of claim 2, wherein the fence pattern penetrates the second sub layer.

4. The image sensor of claim 3, wherein the fence pattern does not penetrate the first sub layer.

5. The image sensor of claim 2, wherein the fence pattern penetrates the first sub layer.

6. The image sensor of claim 2, wherein the third sub layer is thicker than the second sub layer, and
    the second sub layer is thicker than the first sub layer.

7. The image sensor of claim 2, wherein the second sub layer comprises at least one of hafnium oxide, tantalum oxide, or titanium oxide.

8. The image sensor of claim 2, wherein the anti-reflection layer further comprises a fourth sub layer on the third sub layer, and
    the fourth sub layer is pierced by the fence pattern.

9. The image sensor of claim 8, wherein the fourth sub layer comprises a same material as the second sub layer.

10. The image sensor of claim 1, wherein the plurality of unit pixels comprise photoelectric conversion regions,
    the image sensor comprises a separation pattern separating the photoelectric conversion regions from each other, and
    the fence pattern is overlapped with the separation pattern.

11. The image sensor of claim 10, wherein each of the fence pattern and the separation pattern has a grid shape.

12. The image sensor of claim 10, wherein a bottom surface of the fence pattern is in contact with a top surface of the separation pattern.

13. The image sensor of claim 10, wherein a lower width of the fence pattern is smaller than an upper width of the separation pattern.

14. The image sensor of claim 10, further comprising an interface between the fence pattern and the separation pattern within the anti-reflection layer.

15. The image sensor of claim 1, wherein the fence pattern has a refractive index of 1.3 or lower.

16. The image sensor of claim 1, wherein the protection layer is provided between the color filters and the anti-reflection layer to cover a top surface of the fence pattern.

17. The image sensor of claim 1, wherein a top surface of the fence pattern is higher than top surfaces of the color filters.

18. The image sensor of claim 1, wherein a width of the fence pattern gradually decreases from a top surface of the fence pattern to a bottom surface of the fence pattern.

19. An image sensor, comprising:
    a plurality of unit pixels provided in a substrate;
    a color filter array provided on the plurality of unit pixels, the color filter array comprising color filters;
    an anti-reflection layer disposed between the plurality of unit pixels and the color filter array; and
    a fence pattern including a lower portion buried in the anti-reflection layer and an upper portion separating the color filters from each other,
    wherein a width of the upper portion of the fence pattern is greater than a width of the lower portion, and
    wherein the anti-reflection layer comprises anti-reflection patterns, which are separated from each other by the fence pattern and are provided on the plurality of unit pixels, respectively,
    wherein each of the plurality of unit pixels comprises a photoelectric conversion region,
    wherein the image sensor further comprises a separation pattern separating photoelectric conversion regions from each other, wherein at least a portion of the separation pattern is formed of a material including silicon,
    wherein the fence pattern is overlapped with the separation pattern, and
    wherein a lower width of the fence pattern is smaller than an upper width of the separation pattern.

20. The image sensor of claim 19, wherein a bottom surface of the fence pattern is in contact with a top surface of the separation pattern.

* * * * *